US006992550B2

(12) United States Patent
Rawnick et al.

(10) Patent No.: US 6,992,550 B2
(45) Date of Patent: Jan. 31, 2006

(54) ADJUSTABLE TRANSMISSION LINE STUB INCLUDING A CONDUCTIVE FLUID

(75) Inventors: James J. Rawnick, Palm Bay, FL (US); Stephen B. Brown, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 120 days.

(21) Appl. No.: 10/640,237

(22) Filed: Aug. 13, 2003

(65) Prior Publication Data

US 2005/0035834 A1 Feb. 17, 2005

(51) Int. Cl.
*H03H 7/38* (2006.01)

(52) U.S. Cl. .......................................... 333/263; 333/33

(58) Field of Classification Search ................. 333/263, 333/33, 246, 35
See application file for complete search history.

(56) References Cited

U.S. PATENT DOCUMENTS

| | | | | | |
|---|---|---|---|---|---|
| 4,906,956 | A | * | 3/1990 | Kakihana | 333/246 |
| 5,162,972 | A | | 11/1992 | Gripshover et al. | 361/277 |
| 5,792,236 | A | | 8/1998 | Taylor et al. | 75/715 |
| 5,877,123 | A | * | 3/1999 | Das | 505/210 |
| 6,512,496 | B2 | | 1/2003 | Alexeff et al. | |
| 6,515,235 | B2 | | 2/2003 | Moller | 174/256 |
| 2003/0160724 | A1 | | 8/2003 | Alexeff et al. | |
| 2004/0130497 | A1 | | 7/2004 | Alexeff et al. | |

OTHER PUBLICATIONS

U.S. patent application Ser. No. 10/369,436, Rawnick et al., filed Feb. 18, 2003.
U.S. patent application Ser. No. 10/387,208, Rawnick et al., filed Mar. 11, 2003.
U.S. patent application Ser. No. 10/330,755, Rawnick et al., filed Dec. 27, 2002.
U.S. patent application Ser. No. 10/330,754, Rawnick et al., filed Dec. 27, 2002.
U.S. patent application Ser. No. 10/300,456, Rawnick et al., filed Nov. 19, 2002.
U.S. patent application Ser. No. 10/361,548, Rawnick et al., filed Feb. 10, 2003.
U.S. patent application Ser. No. 10/387,209, Rawnick et al., filed Mar. 11, 2003.
U.S. patent application Ser. No. 10/387,194, Brown et al., filed Mar. 11, 2003.
U.S. patent application Ser. No. 10/438,435, Brown et al., filed May 15, 2003.
U.S. patent application Ser. No. 10/414,696, Brown et al., filed Apr. 16, 2003.
U.S. patent application Ser. No. 10/637,027, Brown et al., filed Aug. 7, 2003.

(Continued)

*Primary Examiner*—Stephen E. Jones
(74) *Attorney, Agent, or Firm*—Sacco & Associates, PA

(57) ABSTRACT

A circuit for processing radio frequency signals that includes an adjustable transmission line stub (104). The adjustable transmission line stub (104) has an input (106) at one end, an electrical length and a termination (112). The circuit also includes a signal return conductor (124) and at least one fluid conduit (114) extending from the transmission line stub (104) to the signal return conductor (124). A fluid control system (150) is provided for selectively moving a conductive fluid (126) from a first position to a second position. The fluid control system is responsive to a control signal (174) for selectively moving the conductive fluid (126) between the first and second position. The fluid control system (150) can include a pump (154, 158, 156) for moving the conductive fluid (126) between the first position and the second position.

26 Claims, 4 Drawing Sheets

OTHER PUBLICATIONS

U.S. patent application Ser. No. 10/414,650, Brown et al., filed Apr. 16, 2003.
U.S. patent application Ser. No. 10/635,629, Brown et al., filed Aug. 6, 2003.
U.S. patent application Ser. No. 10/459,067, Brown et al., filed Jun. 11, 2003.
U.S. patent application Ser. No. 10/438,436, Rawnick et al., filed May 15, 2003.
U.S. patent application Ser. No. 10/635,582, Rawnick et al., filed Aug. 6, 2003.
U.S. patent application Ser. No. 10/634,219, Rawnick et al., filed Aug. 5, 2003.
U.S. patent application Ser. No. 10/458,859, Rawnick et al., filed Jun. 11, 2003.
U.S. patent application Ser. No. 10/624,378, Brown et al., filed Jul. 22, 2003.
U.S. patent application Ser. No. 10/438,433, Rawnick et al., filed May 15, 2003.
U.S. patent application Ser. No. 10/421,352, Rawnick et al., filed Apr. 23, 2003.
U.S. patent application Ser. No. 10/409,261, Pike, filed Apr. 8, 2003.
U.S. patent application Ser. No. 10/441,743, Pike, filed May 19, 2003.
U.S. patent application Ser. No. 10/628,846, Pike et al., filed Jul. 28, 2003.
U.S. patent application Ser. No. 10/300,455, Brown et al., filed Nov. 19, 2002.
U.S. patent application Ser. No. 10/637,409, Brown et al., filed Aug. 8, 2003.
U.S. patent application Ser. No. 10/640,148, Brown et al., filed Aug. 13, 2003.
U.S. patent application Ser. No. 10/330,756, Rawnick et al., filed Dec. 27, 2002.
U.S. patent application Ser. No. 10/626,090, Brown et al., filed Jul. 24, 2003.
U.S. patent application Ser. No. 10/632,632, Rawnick et al., filed Aug. 1, 2003.
U.S. patent application Ser. No. 10/625,977, Rawnick et al., filed Jul. 24, 2003.
U.S. patent application Ser. No. 10/614,149, Brown et al., filed Jul. 7, 2003.
U.S. patent application Ser. No. 10/620,483, Brown et al., filed Jul. 16, 2003.
U.S. patent application Ser. No. 10/648,913, Brown et al., filed Aug. 27, 2003.
U.S. patent application Ser. No. 10/414,695, Rawnick et al., filed Apr. 16, 2003.
U.S. patent application Ser. No. 10/460,947, Rawnick et al., filed Jun. 13, 2003.
U.S. patent application Ser. No. 10/421,305, Rawnick et al., filed Apr. 23, 2003.
U.S. patent application Ser. No. 10/648,887, Rawnick et al., filed Aug. 27, 2003.

* cited by examiner

ADJUSTABLE TRANSMISSION LINE STUB INCLUDING A CONDUCTIVE FLUID

BACKGROUND OF THE INVENTION

1. Statement of the Technical Field

The inventive arrangements relate generally to transmission line stubs, and more particularly for transmission line stubs that can be dynamically tuned.

2. Description of the Related Art

Transmission line stubs are commonly used in radio frequency (RF) circuits. A transmission line stub is sometimes said to be resonant at a particular frequency, meaning the line has impedance characteristics similar to a resonant circuit at that frequency. Accordingly, transmission line stubs are often referred to as tuned lines or resonant lines. It should be noted, however, that transmission line stub impedance characteristics are actually a function of voltage reflections, not circuit resonance.

On printed circuit boards or substrates, transmission line stubs are typically implemented by creating a line with at least one port at the input, and either an open circuit or short circuit to ground at the termination. On an open circuited transmission line stub, each point at an even number of quarter-wavelengths from the termination is at a position of voltage maxima and has a high impedance, while each point at an odd number or quarter wavelengths from the termination is at a position of voltage minimum and has a low impedance. Notably, the relative positions of voltage maxima and minima on a shorted-circuited transmission line stub are reversed in comparison to the positions of voltage maxima and minima on an open circuited transmission line stub.

The input impedance to an open or shorted transmission line stub is typically resistive when the length of the transmission line stub is an even or odd multiple of a quarter-wavelength of the operational frequency. That is, the input to the transmission line stub is at a position of voltage maxima or minima. When the input to the transmission line stub is at a position between the voltage maxima and minima points, the input impedance can have reactive components. Consequently, properly chosen transmission line stubs may be used to provide complex impedance characteristics.

Transmission line stubs in RF circuits are typically formed in one of three ways. One configuration known as microstrip, places the signal line on the top of a board surface. A second conductive layer, commonly referred to as a ground plane, is spaced apart from and below the signal line. A second type of configuration known as buried microstrip is similar except that the signal line is covered with a dielectric substrate material. In a third configuration known as stripline, the signal line is sandwiched between two electrically conductive (ground) planes. Other configurations, including waveguide stubs, are also known in the art.

The electrical characteristics of transmission line stubs generally cannot be modified once formed on an RF circuit board. This is not a problem where only a fixed frequency response is needed. The geometry of the transmission line can be readily designed and fabricated to achieve the proper characteristic impedance. When a variable frequency response is needed, however, use of a fixed length transmission line stub can be a problem.

A similar problem is encountered in RF circuit design with regard to optimization of circuit components for operation on different RF frequency bands. Line impedances and lengths that are optimized for a first RF frequency band may provide inferior performance when used for other bands, either due to impedance variations and/or variations in electrical length. Such limitations can limit the effective operational frequency range for a given RF system.

SUMMARY OF THE INVENTION

The present invention relates to a circuit for processing radio frequency signals that includes an adjustable transmission line stub. The adjustable transmission line stub has an input at one end, an electrical length and a termination. The circuit also includes a signal return conductor and at least one fluid conduit extending from the transmission line stub to the signal return conductor. A fluid control system, which can be responsive to a control signal, is provided for selectively moving a conductive fluid from a first position to a second position. The fluid control system can include a pump for moving the conductive fluid between the first and second positions.

In the first position, the conductive fluid can be disposed in a fluid conduit to provide an electrically conductive path between the transmission line stub and the return conductor to produce a first tuned circuit response. According to one aspect of the invention, the conductive fluid used in the invention can be a liquid metal, a liquid metal alloy and/or a solvent electrolyte mixture.

The fluid conduit can be a bore, a via, a channel and/or a tube. In the second position, the conductive fluid is moved to a second position where the conductive fluid does not provide an electrically conductive path between the transmission line and the return conductor, thereby producing a second tuned circuit response distinct from the first tuned circuit response. A third tuned circuit response, which is different from the first and second tuned circuit responses, can be produced by forming at least a second conductive path with the conductive fluid between the transmission line stub and the signal return conductor.

At least one electrical characteristic of the transmission line stub is changed when the conductive fluid is moved from the first position to the second position. The electrical characteristic can be a position of a voltage maxima or minima on the transmission line stub, and/or an input impedance of the transmission line stub. The transmission line stub can have an electrical length equal to some integer multiple of about one quarter wavelength at a design operating frequency.

DETAILED DESCRIPTION OF THE PREFERRED EMBODIMENTS

The present invention relates to an adjustable transmission line stub. The electrical characteristics of the transmission line stub can be adjusted by changing the termination of the transmission line stub between an open circuit configuration and a short circuit configuration. A conductive fluid is provided to short the transmission line stub to a return conductor in the short circuit configuration. The conductive fluid can be removed to return the transmission line to the open circuit configuration.

Figure 1:
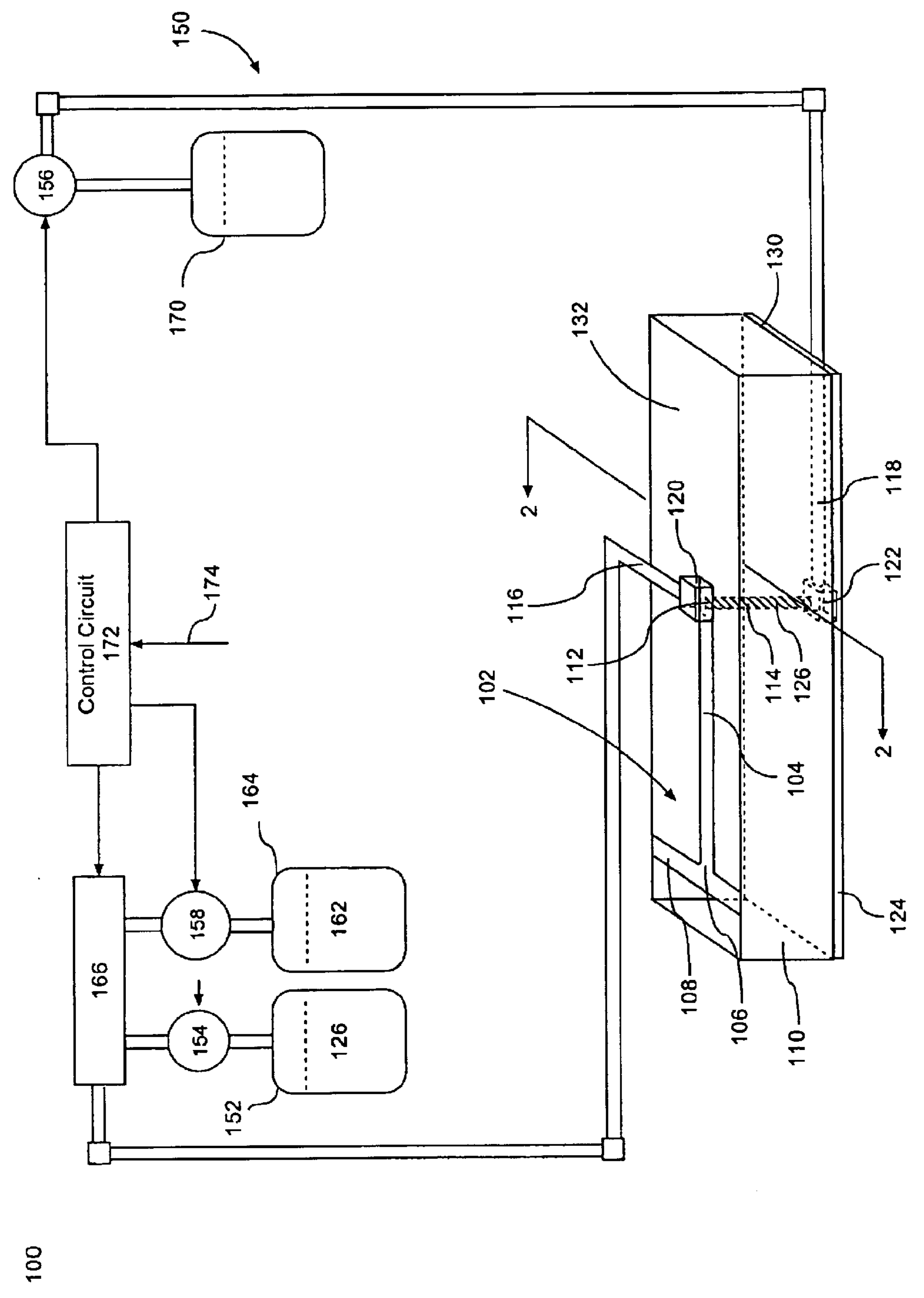
FIG. 1 is a conceptual diagram useful for understanding the variable transmission line stub of the invention.
Figure 2A:
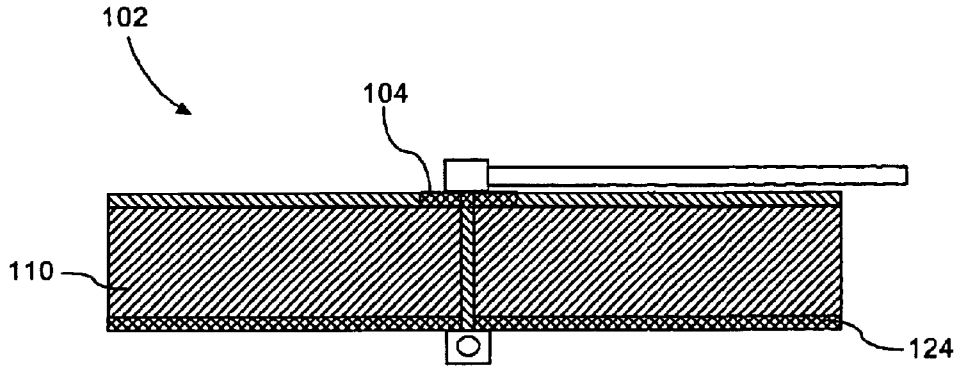
FIG. 2A is a cross-sectional view of the transmission line stub structure in FIG. 1, taken along line section 2—2.

FIG. 1 is a conceptual diagram that is useful for understanding the variable transmission line stub of the present invention. In FIG. 1, a transmission line tuning apparatus 100 is presented which includes a radio frequency circuit 102. The radio frequency circuit 102 includes a transmission line stub 104 and a signal return conductor 124, each of which can be at least partially coupled to a dielectric substrate 110. For example, the signal return conductor 124 can be a ground plane which is coupled to first side 130 of the dielectric substrate 110 opposing the transmission line stub 104 which is coupled to a second side 132. A cross-sectional view of the transmission line stub structure in FIG. 1, taken along line section 2—2, is shown in FIG. 2A. At this point it should be noted that the present invention is not limited to any particular dielectric substrate or insulator. For example, and without limitation, the transmission line stub 104 can be insulated from the signal return line 124 by vacuum, a gas (e.g. air), rubber, plastic, substrate materials (e.g. ceramic, fiberglass, silicon, etc.), or any other dielectric.

Figure 2B:
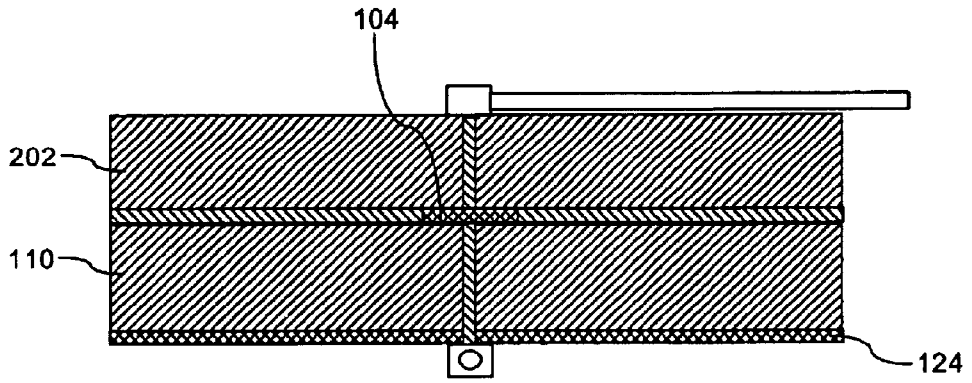
FIG. 2B is a cross-sectional view of an alternative embodiment of a transmission line stub.
Figure 2C:
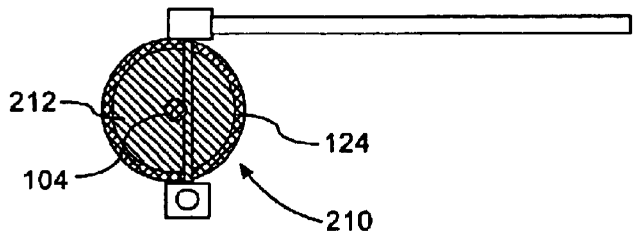
FIG. 2C is a cross-sectional view of another alternate embodiment of a transmission line stub.

While the embodiment of the invention in FIG. 1 is shown essentially in the form of a microstrip construction, the invention herein is not intended to be so limited. Instead, the invention can be implemented using any type of transmission line. For instance, the invention can be implemented in transmission line configurations including conventional waveguides, stripline, buried microstrip, coaxial lines, and embedded coplanar waveguides. All such structures are intended to be within the scope of the invention. An example of a buried microstrip arrangement is shown in FIG. 2B. In this configuration the transmission line stub can be sandwiched between the dielectric substrate 110 and a second dielectric substrate 202. In a stripline configuration, a second ground plane (not shown) can be coupled to a side of the second dielectric substrate 202 opposing the transmission line stub 104. In a coaxial arrangement, which is shown in FIG. 2C, the transmission line stub 104 can be a conductor of a coaxial cable 210 which includes a dielectric insulator 212. In this example, the transmission line stub 104 is presented as the center conductor of the coaxial cable 210 and the outer conductor is shown as the signal return conductor 124. Nonetheless, one skilled in the art will appreciate that this configuration can be reversed so that the transmission line stub is the outer conductor and the inner conductor is the signal return line.

Referring again to FIG. 1, the transmission line stub 104 can be configured to have an input port 106 located where the transmission line stub 104 connects to a transmission line 108, or some other portion of the circuit. The transmission line stub 104 as shown is generally rectangular in shape, but the transmission line stub can be any one of a variety of transmission line stub shapes. For example the transmission line stub 104 can be cylindrical, tapered, or have a complex shape with a variety of different widths, lengths, and/or thicknesses. Moreover, the transmission line stub 104 can be implemented using a printed circuit board, wires, cables and/or other transmission line conductors.

A fluid conduit 114 can extend from the transmission line stub 104 to the signal return conductor 124. The fluid conduit 114 can be any conduit that can contain a conductive fluid 126 so that electrical continuity can be provided between the transmission line stub 104 and the signal return conductor 124 when the conductive fluid 126 is present. In particular, the fluid conduit 114 can be a bore, via, channel, tube or any other type of conduit which extends at least from the transmission line stub 104 to the signal return conductor 124. In one arrangement, the fluid conduit 114 can be a bore that extends from the transmission line stub 104, through the dielectric substrate 110 and to the signal return conductor 124. In another arrangement, the bore can extend through the transmission line stub 104 and the signal return conductor 124 as well. Accordingly, the conductive fluid 126 can be injected into the fluid conduit 114 to electrically short the transmission line stub 104 to the signal return conductor 124 in a first operational state.

In a second operational state, the conductive fluid 126 can be purged from the fluid conduit 114 so that the transmission line stub is open circuited with respect to the signal return conductor 124. For example, a vacuum or positive pressure can be used to purge the conductive fluid 126 from the fluid conduit 114. In one arrangement, the conductive fluid can be replaced with a fluid dielectric 162 or a gas. Typical fluid dielectrics can include oil, such as Vacuum Pump Oil MSDS-12602, and/or solvents, such as formamide. Typical gases can include air, nitrogen, helium, and so on. Importantly, the invention is not limited to any particular fluid dielectric 162 or gas. Those skilled in the art will recognize that the examples of fluid dielectric or gas as disclosed herein are merely by way of example and are not intended to limit in any way the scope of the invention.

As noted, the input impedance at the input port 106 of an open circuited transmission line stub is high if the input port 106 is positioned at a voltage maximum, that is an even number of quarter-wavelengths from the transmission line stub termination 112. The input impedance at the input port 106 of an open circuited transmission line stub 104 is low if the input port 106 is positioned at a voltage minimum, which is an odd number of quarter-wavelengths from the termination 112. However, also as noted, the relative positions of voltage maxima and voltage minima can be reversed by changing the transmission line stub termination from an open circuit to a short circuit. Accordingly, an open circuited transmission line stub which has a low input impedance can be short circuited at the termination 112 to change the input impedance to high. Further, the input impedance to an open circuited transmission line stub can be changed from high to low. Likewise, the input impedance to a transmission line stub having a short circuited termination can be changed from high to low, or from low to high, by removing the short circuit condition.

Figure 3A:
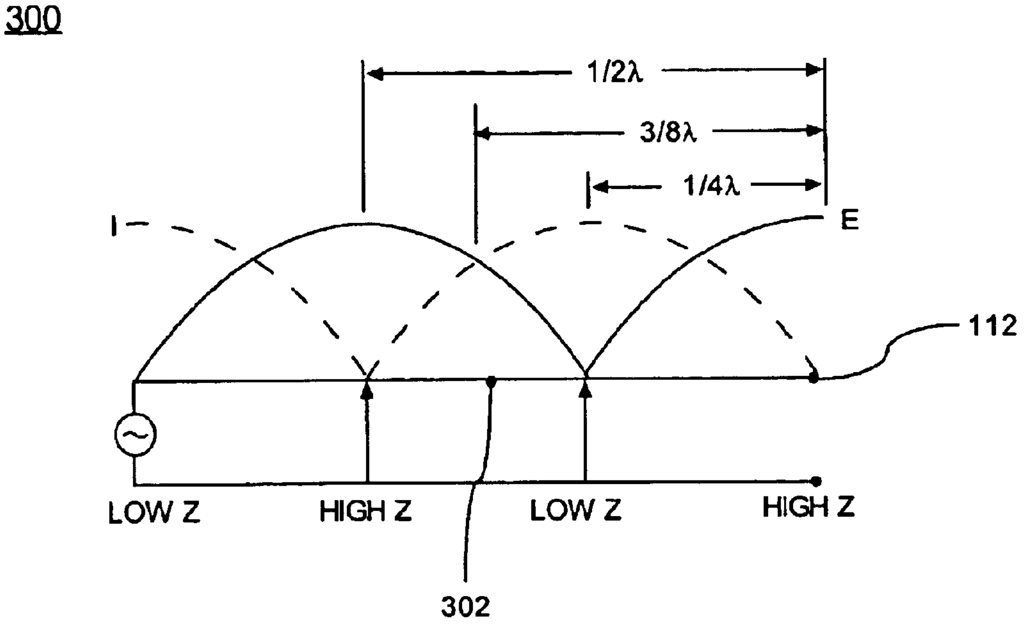
FIG. 3A is a graphical representation of electrical characteristics of a transmission line stub in an open circuit configuration.

If the input port of an open circuited transmission line stub is at a position between voltage maxima and voltage minima, the input impedance will have reactive components. In particular, as shown in graphical representation 300 of FIG. 3A, the voltage minima for an open circuit transmission line stub is typically located at one-quarter of a wavelength from the termination 112 and the voltage maxima is typically located at one-half of a wavelength from the termination 112. Accordingly, the impedance at the point

302 which is three-eighths of a wavelength from the termination 112 will have inductive characteristics since the impedance at that point will increase as the frequency increases and the impedance will decrease as the frequency decreases. It should be noted that the change in impedance is caused by the change in relative positions of voltage maxima and voltage minima resulting from changes in signal wavelength as the frequency is varied. The positions of voltage maxima and minima will move closer to the termination when the frequency increases and further from the termination as the frequency decreases.

Figure 3B:
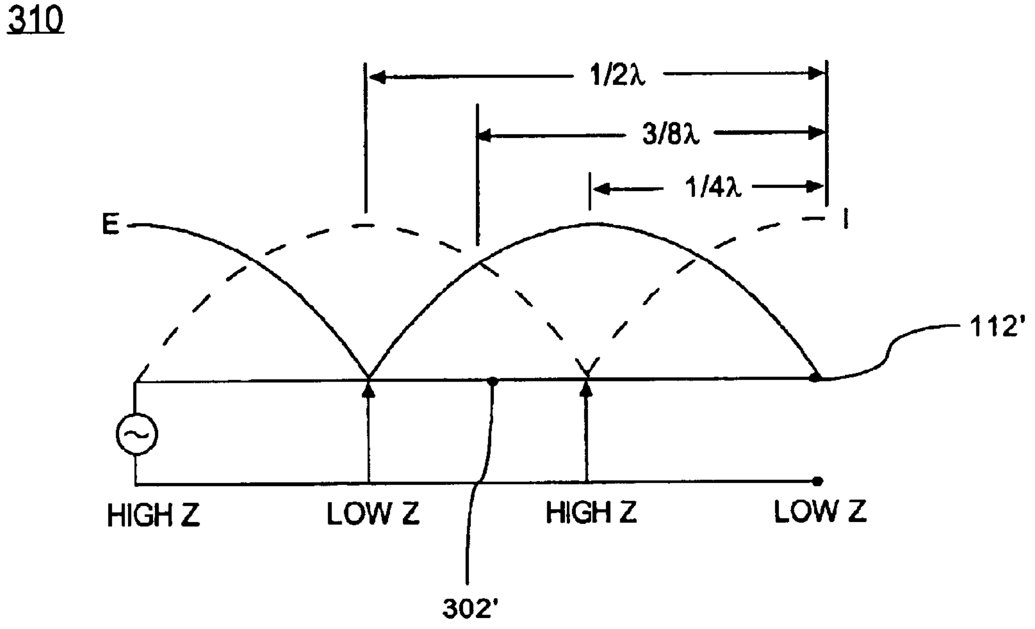
FIG. 3B is a graphical representation of electrical characteristics of a transmission line stub in a short circuit configuration.

If the same transmission line stub is short circuited, as shown in the graphical representation 310 of FIG. 3B, the voltage maxima typically will be located at one-quarter wavelength from the termination 112 and the voltage minima typically will be located at one-half wavelength. Accordingly, the impedance at point 302' which is three-eighths of a wavelength from the termination 112 will have capacitive characteristics since the impedance at this point 302' will decrease with an increase in frequency and increase with a decrease in frequency. Hence, it becomes apparent that by changing the termination of a transmission line stub from open circuit to short circuit, or from short circuit to open circuit, the impedance characteristics of transmission line stub having reactive impedance components also can be changed. For example, a transmission line stub which presents a capacitive input impedance can be changed to have an inductive input impedance, and vice versa.

Fluid Control System

Referring once again to FIG. 1, it can be seen that the invention preferably includes a fluid control system 150 for selectively controlling the presence and/or removal of the conductive fluid 126 from the fluid conduit 114. The fluid control system can comprise any suitable arrangement of pumps, valves and/or conduits that are operable for effectively injecting and/or removing conductive fluid 126. A wide variety of such fluid control systems may be implemented by those skilled in the art. For example, in one embodiment, the fluid control system can include a reservoir 152 for conductive fluid 126 and a pump 154 for injecting the conductive fluid into the fluid conduit 114.

The conductive fluid 126 can be injected into the fluid conduit 114 by means of a suitable fluid transfer conduit 116. A second fluid transfer conduit 118 can also be provided for permitting the conductive fluid 126 to be purged from the fluid conduit 114 so that the conductive fluid 126 does not provide electrical continuity between the transmission line stub 104 and the signal return conductor 124. Further, fluid valves 120, 122 can be provided between the fluid transfer conduits 116, 118 and the fluid conduit 114. The fluid valves 120, 122 can be mini-electromechanical or micro-electromechanical systems (MEMS) valves, which are known to the skilled artisan. The fluid valves 120, 122 can be closed to contain the conductive fluid 126 within the fluid conduit 114 during the first operational state when the transmission line stub is short circuited, and opened when the conductive fluid 126 is purged from the fluid conduit 114.

When it is desired to purge the conductive fluid from the fluid conduit 114, a pump 156 can be used to draw the conductive fluid 126 from the fluid conduit 114 into reservoir 170. Alternatively, in order to ensure a more complete removal of all conductive fluid from the fluid conduit 114, one or more pumps 158 can be used to inject a dielectric solvent 162 into the fluid conduit 114. The dielectric solvent 162 can be stored in a second reservoir 164 and can be useful for ensuring that the conductive fluid 126 is completely and efficiently flushed from the fluid conduit 114. A control valve 166 can be used to selectively control the flow of conductive fluid 126 and dielectric solvent 162 into the fluid conduit 114. A mixture of the conductive fluid 126 and any excess dielectric solvent 162 that has been purged from the fluid conduit 114 can be collected in a recovery reservoir 170. For convenience, additional fluid processing, not shown, can also be provided for separating dielectric solvent from the conductive fluid contained in the recovery reservoir for subsequent reuse. However, the additional fluid processing is a matter of convenience and not essential to the operation of the invention.

A control circuit 172 can be configured for controlling the operation of the fluid control system 150 in response to an analog or digital fluid control signal 174. For example, the control circuit 172 can control the operation of the various valves 120, 122, 166, and pumps 154, 156, 158 necessary to selectively control the presence and removal of the fluid dielectric and the dielectric solvent from the fluid conduit 114. It should be understood that the fluid control system 150 is merely one possible implementation among many that could be used to inject and purge conductive fluid from the fluid conduit 114 and the invention is not intended to be limited to any particular type of fluid control system. All that is required of the fluid control system is the ability to effectively control the presence and removal of the conductive fluid 126 from the fluid conduit 114.

Composition of Conductive Fluid

According to one aspect of the invention, the conductive fluid used in the invention can be selected from the group consisting of a metal or metal alloy that is liquid at room temperature. The most common example of such a metal would be mercury. However, other electrically-conductive, liquid metal alloy alternatives to mercury are commercially available, including alloys based on gallium and indium alloyed with tin, copper, and zinc or bismuth. These alloys, which are electrically conductive and non-toxic, are described in greater detail in U.S. Pat. No. 5,792,236 to Taylor et al, the disclosure of which is incorporated herein by reference. Other conductive fluids include a variety of solvent-electrolyte mixtures that are well known in the art. As for conductivity, using a non-perfect conductor, some energy will pass through and some will be dissipated as heat in the conductive material. Conductivities greater than 20 would be desirable, although effective systems could be employed utilizing conductivities as low as 1 or 2.

Multiple Fluid Conduits

Figure 4A:
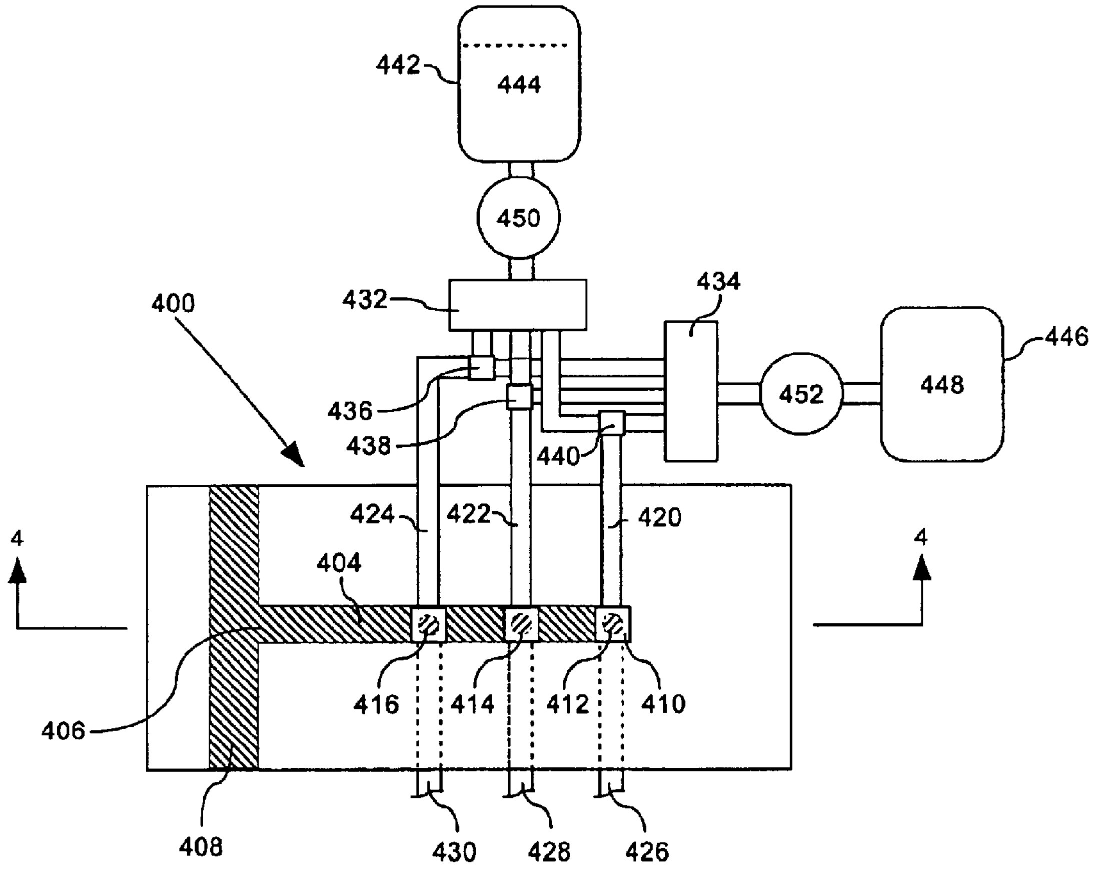
FIG. 4A is a top view of yet another embodiment of a transmission line stub.
Figure 4B:
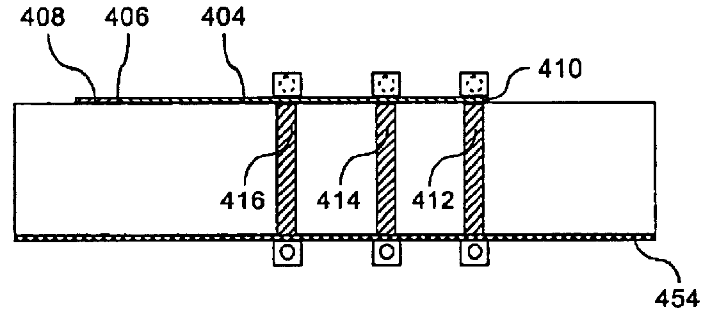
FIG. 4B is a cross-sectional view of the transmission line stub structure in FIG. 4A, taken along section line 4—4.

In the most basic form, the invention can be implemented using a single fluid conduit. However, multiple fluid conduits can be used to adjust the transmission line stub. Referring to FIG. 4A, an exemplary radio frequency circuit 400 comprising a plurality of fluid conduits 412, 414, 416 is shown. A cross-sectional view of FIG. 4A taken along section lines 4—4 is shown in FIG. 4B. Notably, three fluid conduits are shown for exemplary purposes, but any number of fluid conduits can be provided. The fluid conduits 412, 414, 416 can be disposed to provide a short circuit termination of the transmission line stub 404 at various points along the length of the transmission line stub 404. Accordingly, the distance between the input port 406 and the termination of the transmission line stub can be varied. In consequence, a particular input impedance to the transmission line stub 404 can be selected by injecting a conductive fluid 444 into the appropriate fluid conduit 412, 414, 416.

For example, fluid conduit 412 can be filled with conductive fluid 444 to short the transmission line stub 404 at, or near, the end 410 of the transmission line stub 404.

Accordingly, the input impedance of the transmission line stub 404 can be changed with respect to the open circuit input impedance, as previously noted. While fluid conduit 412 remains filled with conductive fluid and fluid conduits 414, 416 are unfilled, or filled with a dielectric fluid or gas, the effective length of the transmission line stub will be determined by location of the fluid conduit 412 which is located at the end 410 of the transmission line stub 404.

Fluid conduit 414 can be located at a distance from the end 410 of the transmission line stub 404, for instance one-eighth of a wavelength. The fluid conduit 414 can be filled with conductive fluid 444 if it is desired to short circuit the transmission line stub to the signal return conductor 454 at the location of the fluid conduit 414. Accordingly, the electrical length of the transmission line stub 404 can be effectively reduced by one-eighth of a wavelength, resulting in a corresponding change to the input impedance of the transmission line stub 404. Likewise, fluid conduit 416 can be filled with conductive fluid 444 to further shorten the effective length of the transmission line stub.

As noted, the fluid control system can comprise any suitable arrangement of pumps, valves, conduits and controllers that are operable for effectively injecting and removing conductive fluid 444, or any other fluid or gas, from the fluid conduits 412, 414, 416. For example, the fluid control system can include reservoirs 442, 446, control valves 432, 434, 436, 438, 440 and pumps 450, 452 to inject the conductive fluid 444 or fluid dielectric 448 in the appropriate fluid conduit. The fluid control system also can include fluid transfer conduits 420, 422, 424 to couple the fluid control system to the fluid conduits 412, 414, 416. Further, fluid transfer conduits 426, 428, 438 and an appropriate pump (not shown) can be provided to remove the conductive fluid 444 or fluid dielectric 448 from the fluid conduits 412, 414, 416.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A system for variably tuning a transmission line stub, comprising:

a transmission line stub having a predetermined electrical length for producing a first tuned circuit response; and a fluid control system responsive to a control signal for selectively forming a first conductive path with a conductive fluid between said transmission line stub and a signal return conductor, said first conductive path producing a second tuned circuit response with said transmission line stub different from said first tuned circuit response.

2. The system according to claim 1 wherein said first conductive path is formed at an end of said transmission line stub opposed from an input port of said transmission line stub.

3. The system according to claim 1 wherein said transmission line stub has an electrical length between an input and said first conductive path that is an integer multiple of one quarter wavelength at an anticipated operational frequency.

4. The system according to claim 1 wherein said fluid control system is responsive to a control signal for selectively producing at least a third tuned circuit response by forming at least a second conductive path with said conductive fluid between said transmission line stub and said return signal conductor at a location spaced along said transmission line from said first conductive path, said third tuned circuit response different from said first and said second tuned circuit responses.

5. The system according to claim 4 wherein said transmission line stub has an electrical length between an input and at least one of said first and said second conductive paths, that is an integer multiple of one quarter wavelength with respect to at least one anticipated operational frequency.

6. The system according to claim 1 further comprising a conduit extending between said transmission line stub and said signal return conductor and wherein said fluid control system forms said conductive path by injecting said conductive fluid into said conduit.

7. The system according to claim 6 wherein said fluid control system comprises at least one pump for injecting said conductive fluid.

8. The system according to claim 6 wherein said fluid control system comprises at least one pump for purging said conductive fluid from said conduit.

9. The system according to claim 8 wherein said fluid control system purges said conductive fluid from said conduit with a second fluid.

10. A system for variably tuning a transmission line stub, comprising:

a transmission line stub having an input at one end, an electrical length and a termination;

a signal return conductor;

at least one fluid conduit extending from at least said transmission line stub to at least said signal return conductor;

a conductive fluid; and a fluid control system for selectively moving said conductive fluid from a first position where said conductive fluid provides an electrically conductive path between said transmission line stub and said return conductor to produce a first tuned circuit response, to a second position where said conductive fluid does not provide an electrically conductive path between said transmission line and said return conductor to produce a second tuned circuit response distinct from said first tuned circuit response.

11. The system to claim 10 wherein at least one electrical characteristic of said transmission line stub is changed when said conductive fluid is moved from said first position to said second position.

12. The system according to claim 11 wherein said electrical characteristic is selected from the group consisting of a location of at least one of a voltage maxima on said transmission line stub, a location of at least one of a voltage minima on said transmission line stub, and an input impedance of said transmission line stub.

13. The system according to claim 10 wherein said fluid control system includes a pump for moving said conductive fluid between said first position and said second position.

14. The system according to claim 13 wherein said first position is defined by a fluid conduit extending from at least said transmission line stub to at least said signal return conductor.

15. The system according to claim 14 wherein said fluid conduit is selected from the group consisting of a bore, a via, a channel and a tube.

16. The system according to claim 10 wherein said conductive fluid is comprised of at least one of a liquid metal, a liquid metal alloy and a solvent electrolyte mixture.

17. The system according to claim 10 wherein said fluid control system is responsive to a control signal for selectively moving said conductive fluid between said first and second position.

18. The system according to claim 10 wherein said fluid control system is responsive to a control signal for selectively moving a fluid dielectric to said first position.

19. A method for tuning an transmission line stub, comprising the steps of:

producing a first tuned circuit response with a transmission line stub; and responsive to a control signal, selectively producing a second tuned circuit response with said transmission line stub by forming a first conductive path with a conductive fluid between said transmission line stub and a signal return conductor, said second tuned circuit response different from said first tuned circuit response.

20. The method according to claim 19 further comprising the step of forming said first conductive path at an end of said transmission line stub opposed from an input port of said transmission line stub.

21. The method according to claim 19 further comprising the step of selecting said transmission line stub to have an electrical length between an input and said first conductive path that is an integer multiple of one quarter wavelength at an anticipated operational frequency.

22. The method according to claim 19 further comprising the step of selectively producing in response to a control signal at least a third tuned circuit response by forming at least a second conductive path with said conductive fluid between said transmission line stub and said return signal conductor at a location spaced along said transmission line from said first conductive path, said third tuned circuit response different from said first and said second tuned circuit responses.

23. The method according to claim 22 further comprising the step of selecting said transmission line stub to have an electrical length between an input and at least one of said first and said second conductive paths, that is an integer multiple of one quarter wavelength with respect to at least one anticipated operational frequency.

24. The method according to claim 19 further comprising the step of forming said conductive path by injecting said conductive fluid into a conduit extending between said transmission line stub and said signal return conductor.

25. The method according to claim 24 further comprising the step of purging said conductive fluid from said conduit.

26. The method according to claim 25 wherein said purging step is further comprised of injecting a solvent fluid into said conduit to flush any conductive fluid.

* * * * *